United States Patent
Nositschka et al.

(10) Patent No.: US 10,056,515 B2
(45) Date of Patent: Aug. 21, 2018

(54) ROOF PANEL HAVING AN INTEGRATED PHOTOVOLTAIC MODULE

(71) Applicant: Saint-Gobain Glass France, Courbevoie (FR)

(72) Inventors: Andreas Nositschka, Aachen (DE); Pascal Remy, Uebach-Palenberg (DE); Marc-Oliver Prast, Herzogenrath (DE); Dirk Neumann, Herzogenrath (DE); Harald Stoffel, Alsdorf (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/400,719

(22) PCT Filed: May 17, 2013

(86) PCT No.: PCT/EP2013/060245
§ 371 (c)(1),
(2) Date: Nov. 12, 2014

(87) PCT Pub. No.: WO2013/182398
PCT Pub. Date: Dec. 12, 2013

(65) Prior Publication Data
US 2015/0129013 A1 May 14, 2015

(30) Foreign Application Priority Data
Jun. 5, 2012 (EP) .................... 12170870

(51) Int. Cl.
*H01L 31/048* (2014.01)
*H01L 31/18* (2006.01)
(Continued)

(52) U.S. Cl.
CPC ...... *H01L 31/048* (2013.01); *B32B 17/10018* (2013.01); *B32B 17/1077* (2013.01);
(Continued)

(58) Field of Classification Search
CPC ... H01L 31/00; H01L 31/02; H01L 31/02008; H01L 31/02016; H01L 31/0203;
(Continued)

(56) References Cited

U.S. PATENT DOCUMENTS

| 3,666,614 A | 5/1972 | Snedeker et al. |
| 4,663,228 A | 5/1987 | Bolton et al. |

(Continued)

FOREIGN PATENT DOCUMENTS

| CN | 1426439 A | 6/2003 |
| CN | 1595666 A | 3/2005 |

(Continued)

OTHER PUBLICATIONS

International Search Report dated Jul. 22, 2013 for International Application PCT/EP2013/060246 filed on May 17, 2013 in the name of Saint-Gobain Glass France.

(Continued)

*Primary Examiner* — Christina Chern
(74) *Attorney, Agent, or Firm* — Steinfl + Bruno LLP

(57) ABSTRACT

A roof panel having an integrated photovoltaic module is described. The roof panel has at least a substrate and an outer panel, which are laminarily bonded to each other by means of a thermoplastic layer, wherein a photovoltaic layer system is embedded in the thermoplastic layer and the substrate contains at least one polymer.

16 Claims, 2 Drawing Sheets

Figure 1:
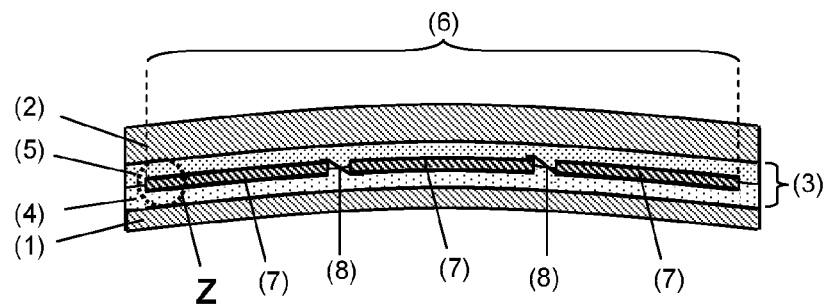

(51) Int. Cl.
| | |
|---|---|
| B32B 17/10 | (2006.01) |
| B62D 25/06 | (2006.01) |
| B60L 8/00 | (2006.01) |
| H01L 31/073 | (2012.01) |
| H01L 31/0735 | (2012.01) |
| H01L 31/0749 | (2012.01) |
| H01L 51/44 | (2006.01) |
| B62D 29/04 | (2006.01) |

(52) U.S. Cl.
CPC .. *B32B 17/10761* (2013.01); *B32B 17/10788* (2013.01); *B32B 17/10871* (2013.01); *B32B 17/10889* (2013.01); *B60L 8/003* (2013.01); *B62D 25/06* (2013.01); *B62D 29/043* (2013.01); *H01L 31/0488* (2013.01); *H01L 31/073* (2013.01); *H01L 31/0735* (2013.01); *H01L 31/0749* (2013.01); *H01L 31/18* (2013.01); *H01L 51/448* (2013.01); *B32B 2327/12* (2013.01); *B32B 2333/12* (2013.01); *B32B 2369/00* (2013.01); *Y02B 10/12* (2013.01); *Y02E 10/50* (2013.01); *Y02T 10/90* (2013.01)

(58) Field of Classification Search
CPC ..... H01L 31/04; H01L 31/042; H01L 31/048; H01L 31/0488; H01L 31/05; H01L 31/0504
See application file for complete search history.

(56) References Cited

U.S. PATENT DOCUMENTS

| | | | |
|---|---|---|---|
| 4,686,321 A | 8/1987 | Kishi | |
| 4,860,509 A | 8/1989 | Laaly et al. | |
| 5,059,254 A | 10/1991 | Yaba et al. | |
| 6,215,060 B1* | 4/2001 | Komori | B32B 27/08 136/251 |
| 6,870,087 B1 | 3/2005 | Gallagher | |
| 2003/0005954 A1 | 1/2003 | Emoto et al. | |
| 2003/0144420 A1* | 7/2003 | Tsumura | C08G 77/50 525/100 |
| 2005/0051204 A1* | 3/2005 | Oi | H01L 31/048 136/251 |
| 2007/0012353 A1* | 1/2007 | Fischer | H01L 31/048 136/251 |
| 2007/0295390 A1* | 12/2007 | Sheats | B32B 17/1077 136/251 |
| 2008/0223429 A1 | 9/2008 | Everett et al. | |
| 2008/0283115 A1 | 11/2008 | Fukawa et al. | |
| 2009/0205270 A1 | 8/2009 | Shaw et al. | |
| 2010/0065116 A1 | 3/2010 | Stancel et al. | |
| 2010/0252107 A1 | 10/2010 | Suga | |
| 2011/0139225 A1* | 6/2011 | Boydell | H01L 31/048 136/251 |
| 2011/0226312 A1 | 9/2011 | Bohm et al. | |
| 2011/0315189 A1 | 12/2011 | Ge et al. | |
| 2012/0097218 A1 | 4/2012 | Vandal et al. | |
| 2012/0279559 A1 | 11/2012 | Stollwerck et al. | |
| 2013/0244370 A1 | 9/2013 | Tadakuma | |
| 2013/0276876 A1* | 10/2013 | Kerkar | H01L 31/0527 136/256 |
| 2015/0136207 A1 | 5/2015 | Giron et al. | |

FOREIGN PATENT DOCUMENTS

| | | |
|---|---|---|
| CN | 101192630 | 6/2008 |
| CN | 101192632 | 6/2008 |
| DE | 3713854 | 10/1987 |
| DE | 3727825 | 3/1989 |
| DE | 4006756 | 9/1991 |
| DE | 4105389 | 6/1992 |
| DE | 102008030927 | 10/2009 |
| EP | 0221287 | 5/1987 |
| EP | 2071635 | 6/2009 |
| EP | 2200097 | 6/2010 |
| JP | S625671 A | 1/1987 |
| JP | S62128652 U | 8/1987 |
| JP | S62186447 U | 11/1987 |
| JP | S63178357 U | 11/1988 |
| JP | H01196181 A | 8/1989 |
| JP | H03204979 | 9/1991 |
| JP | H08236794 A | 9/1996 |
| JP | H0969646 A | 3/1997 |
| JP | H0992867 A | 4/1997 |
| JP | 2002083992 | 3/2002 |
| JP | 2002231990 A | 8/2002 |
| JP | 2006013413 A | 1/2006 |
| JP | 2006165169 A | 6/2006 |
| JP | 2007035694 A | 2/2007 |
| JP | 2009130193 A | 6/2009 |
| JP | 2010021500 A | 1/2010 |
| JP | 2010149506 A | 7/2010 |
| JP | 2011046697 A | 3/2011 |
| JP | 2011151334 A | 8/2011 |
| JP | 2011187555 A | 9/2011 |
| JP | 2011530444 A | 12/2011 |
| JP | 2012033573 A | 2/2012 |
| JP | 2012104575 A | 5/2012 |
| WO | 2009021475 | 2/2009 |
| WO | 2011023777 | 3/2011 |
| WO | 2011/042361 A1 | 4/2011 |
| WO | WO 2011154472 A1 * | 12/2011 ....... H01L 21/67173 |
| WO | 2012/054088 A2 | 4/2012 |

OTHER PUBLICATIONS

International Search Report dated Aug. 1, 2013 for International Application PCT/EP2013/060245 filed on May 17, 2013 in the name of Saint-Gobain Glass France.

International Preliminary Report on Patentability dated Dec. 9, 2014 for International Application PCT/EP2013/060245 filed on May 17, 2013 in the name of Saint-Gobain Glass France.

International Preliminary Report on Patentability dated Dec. 9, 2014 for International Application PCT/EP2013/060246 filed on May 17, 2013 in the name of Saint-Gobain Glass France.

Final Office Action for U.S. Appl. No. 14/400,464, filed Nov. 11, 2014 on behalf of Jean-Christophe Giron, dated Jun. 8, 2016. 20 pages.

Meyer, N. "CIS thin-film solar cells: Photovoltaic on glass" Phys. Our Time; Mar. 2004; vol. 35; No. 2; pp. 82-85 (German original + English translation).

Non-Final Office Action for U.S. Appl. No. 14/400,464, filed Nov. 11, 2014 on behalf of Jian-Christopher Giron, dated Dec. 21, 2016. 37 pages.

Final Office Action for U.S. Appl. No. 14/400,464, filed Nov. 11, 2014 on behalf of Jean-Christophe Giron, et al., dated Jul. 3, 2017. 34 pages.

Non-Final Office Action issued for U.S. Appl. No. 14/400,464, filed Nov. 11, 2014 in the name of Saint-Gobain Glass France, dated Mar. 1, 2016. 21 pages.

Non-Final Office Action issued for U.S. Appl. No. 14/400,464, filed Nov. 11, 2014 on behalf of Saint-Gobain Glass France, dated Oct. 30, 2017. 40 pages.

Final Office Action for U.S. Appl. No. 14/400,464 filed Nov. 11, 2014 on behalf of Saint-Gobain Glass France. dated Mar. 19, 2018. 54 pages.

* cited by examiner

ROOF PANEL HAVING AN INTEGRATED PHOTOVOLTAIC MODULE

CROSS REFERENCE TO RELATED APPLICATIONS

The present application is the US national stage of International Patent Application PCT/EP2013/060245 filed on May 17, 2013 which, in turn, claims priority to European application 12170870.5 filed on Jun. 5, 2012.

The invention relates to a roof panel having an integrated photovoltaic module, a method for its production, and use thereof.

It is known that photovoltaic modules can be integrated into the roof panel of vehicles. Such roof panels are known, for example, from DE 3713854 A1, DE 4006756 A1, DE 4105389 C1, and US 20120097218 A1.

Conventional roof panels having an integrated photovoltaic module are typically implemented as composite panels made of two glass panels, between which the photovoltaic module is arranged. Such roof panels have the disadvantage of having a high weight. Many conventional roof panels having an integrated photovoltaic module, in particular having an integrated photovoltaic module based on crystalline silicon, also have the disadvantage that only small areas can be provided with the photovoltaic module and that the roof panels can have only a slight curvature.

The object of the present invention to provide an improved roof panel having an integrated photovoltaic module. The roof panel should have a low weight. Moreover, it should be possible to provide most of the area of the roof panel with the photovoltaic module and to provide the roof panel with a strong curvature. In addition, the roof panel should be simple and economical to produce.

The object of the present invention is accomplished according to the invention by a roof panel having an integrated photovoltaic module according to the independent claim 1. Preferred embodiments emerge from the subclaims.

The roof panel according to the invention having an integrated photovoltaic module comprises at least a substrate and an outer panel, which are laminarily bonded to each other by means of a thermoplastic layer, with a photovoltaic layer system embedded in the thermoplastic layer and with the substrate containing at least one polymer.

The roof panel according to the invention is provided for the purpose of delimiting the interior, for example, of a motor vehicle from the external surroundings, in the region of the roof. According to the invention, the outer panel is turned toward the external surroundings.

The substrate is turned toward the interior. The solar radiation enters the roof panel via the outer panel and strikes the photovoltaic layer system inside the thermoplastic layer.

The advantage of the invention resides in the substrate according to the invention, which contains at least one polymer. According to the prior art, roof panels with an integrated photovoltaic module typically comprise two glass panels bonded to each other by lamination. In comparison thereto, a clear reduction of the weight of the roof panel is achieved by the polymeric substrate according to the invention. It has been demonstrated that, despite the polymeric substrate, roof panels according to the invention have adequate stability to enable them to be used, for example, in motor vehicles. The roof panel according to the invention is, moreover, more economical to produce than conventional roof panels. The photovoltaic layer system can be arranged extensively in the thermoplastic layer and roof panels with strong curvature can be realized.

The surfaces of the substrate facing away from each other and the outer panel preferably form the outer surfaces of the roof panel. This means that no further elements, for example, no further panels, are arranged on the surfaces of the substrate facing away from each other and on the outer panel. In particular, it is not necessary to arrange another glass panel on the surface of the polymeric substrate facing away from the outer panel in order to obtain adequate stability of the roof panel. The particular advantage resides in the low weight of the roof panel. The surfaces of the substrate and the outer panel facing away from each other can, however, have coatings. The polymeric substrate can have, for example, a protective coating, for example, a UV protective layer or a layer to protect against damage from scratching.

The substrate is preferably made from plastic. The substrate contains, in particular, no glass, for example, as a glass panel. In particular, no glass panel is arranged on the interior side of the photovoltaic layer system. This means that the roof panel according to the invention contains no glass panel that has less distance from the interior delimited by the roof panel than the photovoltaic layer system.

In an advantageous embodiment of the invention, the substrate is implemented as a rigid panel. The substrate can contain, for example, at least polyethylene (PE), polycarbonate (PC), polypropylene (PP), polystyrene (PS), polybutadiene, polynitriles, polyesters, polyurethane (PU), polymethyl methacrylate (PMMA), polyvinyl chloride (PVC), polyacrylate, polyamide, polyethylene terephthalate (PET), acrylonitrile butadiene styrene (ABS), styrene acrylonitrile (SAN), acrylonitrile styrene acrylester (ASA), and/or copolymers or mixtures thereof. The substrate preferably contains at least one thermoplastic polymer. The substrate particularly preferably contains at least polycarbonate (PC) and/or polymethyl methacrylate (PMMA). This is particularly advantageous with regard to the processing, the strength, and the mechanical and chemical resistance of the substrate. The thickness of the substrate is preferably from 0.8 mm to 25 mm, particularly preferably from 0.8 mm to 4 mm, for example, 2.1 mm. The particular advantage of a substrate implemented as a rigid panel resides in the stability of the roof panel according to the invention.

In another advantageous embodiment of the invention, the substrate is implemented as a flexible film. The thickness of the flexible film is preferably from 0.02 mm to 2 mm, particularly preferably from 0.1 mm to 1.5 mm, for example, from 0.4 mm to 1.5 mm, most particularly preferably from 0.15 mm to 0.8 mm, in particular from 0.45 mm to 0.8 mm. The particular advantage resides in a low weight of the roof panel according to the invention and low production costs. The flexible film preferably contains at least one thermoplastic polymer. The thermoplastic polymer is preferably substituted with fluorine. This is particularly advantageous with regard to the chemical and mechanical stability of the substrate. The substrate most particularly preferably contains at least polyvinyl fluoride and/or polyvinylidene fluoride. Equally preferred are ethylene tetrafluoroethylene (ETFE) and/or polytetrafluoroethylene (PTFE). This is particularly advantageous with regard to the chemical and mechanical resistance as well as the adhesion of the thermoplastic layer on the substrate. The substrate can also contain mixtures or copolymers thereof.

In an advantageous embodiment of the invention, the outer panel contains glass, preferably flat glass, float glass, quartz glass, borosilicate glass, or soda lime glass. This is particularly advantageous with regard to the stability of the roof panel according to the invention and the protection of the photovoltaic layer system against external influences, for example, against damage from precipitation such as hail or sleet. The outer panel can be non-prestressed, partially prestressed, prestressed, or cured, for example, thermally or chemically cured.

In another advantageous embodiment of the invention, the outer panel contains at least a polymer, preferably a thermoplastic polymer. The outer panel can contain, for example, at least polyethylene (PE), polycarbonate (PC), polypropylene (PP), polystyrene (PS), polybutadiene, polynitriles, polyesters, polyurethane (PU), polymethyl methacrylate (PMMA), polyvinyl chloride (PVC), polyacrylate, polyamide, polyethylene terephthalate (PET), acrylonitrile butadiene styrene (ABS), styrene acrylonitrile (SAN), acrylonitrile styrene acrylester (ASA), and/or copolymers or mixtures thereof, preferably polycarbonate (PC) and/or polymethyl methacrylate (PM MA). Through the use of a polymeric outer panel, the weight of the roof panel can be further reduced.

When the outer panel is implemented as a polymeric outer panel, the substrate is implemented as a flexible film in a preferred embodiment. Roof panels with a very low weight can thus be realized.

The thickness of the outer panel is preferably from 1.0 mm to 12 mm, particularly preferably from 1.4 mm to 5 mm, for example, 2.1 mm. When the substrate is implemented as a flexible film, the thickness the outer panel is preferably from 2.8 mm to 5 mm. Thus, advantageous stability of the roof panel is achieved.

The thermoplastic layer contains at least one thermoplastic polymer, preferably ethylene vinyl acetate (EVA), polyvinyl butyral (PVB), polyurethane (PU), polyethylene (PE), and/or polyethylene terephthalate (PET). However, the thermoplastic layer can also contain, for example, at least polypropylene, polycarbonate, polymethyl methacrylate, polyacrylate, polyvinyl chloride, polyacetate resin, casting resins, acrylates, fluorinated ethylene propylene, polyvinyl fluoride, and/or ethylene tetrafluoroethylene. The thermoplastic layer preferably has a thickness from 0.5 mm to 5 mm, particularly preferably from 1 mm to 3 mm, most particularly preferably from 1 mm to 2 mm.

The thermoplastic layer ist preferably formed from at least one first thermoplastic film and one second thermoplastic film, between which the photovoltaic layer system is arranged. Each thermoplastic film preferably has a thickness from 0.25 mm to 1 mm, particularly preferably from 0.45 mm to 0.85 mm. The first and the second thermoplastic film can be made from the same or different materials.

However, the thermoplastic layer can also be formed from more than two films. Other films can serve, for example, as protective layers or carrier layers of the photovoltaic layer system before the production of the roof panel.

A peripheral edge region of the thermoplastic layer with a width of, for example, 3 mm to 50 mm is preferably not provided with the photovoltaic layer system. In this edge region, the first and the second thermoplastic film are preferably bonded to each other directly or even via other layers, for example, other polymer layers. The photovoltaic layer structure is thus embedded inside the thermoplastic layer durably stably and without contact with the external surroundings and is advantageously protected against environmental influences, in particular corrosion and mechanical damage.

The roof panel according to the invention can have any three-dimensional shape. The roof panel can be planar or slightly or greatly curved in one or a plurality of spatial directions. The radii of curvature of the curved roof panel can be, for example, from 50 mm to 1200 mm. The radius of curvature does not have to be constant over the entire roof panel. There can be greatly and less greatly curved regions. There can even be planar and curved regions. In conventional roof panels with an integrated photovoltaic module, radii of curvature from 700 mm to 1000 mm typically occur. In contrast, by means of the photovoltaic layer system according to the invention embedded in the thermoplastic layer and the polymeric substrate according to the invention, roof panels that have radii of curvature from 600 mm to 900 mm, preferably from 600 to 650 mm, at least in one region, can be realized.

The area of the roof panel according to the invention can vary widely and thus be ideally adapted to the requirements in the individual case. The area of the roof panel can, for example, be from 100 cm$^2$ all the way to 5 m$^2$ betragen, preferably from 0.5 m$^2$ to 2 m$^2$.

With roof panels, reduced transmittance of visible light is frequently desired in order to avoid direct solar radiation into the interior. The transmittance can, for example, be less than 50%, less than 20%, or even less than 10%. Typically, this is achieved by a tinted and/or colored outer and/or inner panel or by tinted films within the laminate. By means of the light-absorbing photovoltaic layer system, which is arranged extensively inside the roof panel, the transmittance of visible light through the roof panel is advantageously reduced such that the outer panel, the substrate, and the thermoplastic layers can be implemented transparent and clear. Such transparent outer panels, substrates, and thermoplastic layers are simple and more economical to produce and result in a reduced risk of corrosion of, for example, functional coatings applied on the outer panel. The transmittance of visible light through the roof panel in the region of the photovoltaic layer system is preferably less than 50%.

The photovoltaic layer system effects the charge carrier separation required for the conversion of radiation energy into electrical energy. The photovoltaic layer system is preferably a thin-film system. This includes layer systems with thicknesses of only a few microns. The particular advantage resides in low thickness and high flexibility of the thermoplastic layer according to the invention. The high flexibility of the thermoplastic layer has, in particular, the advantage that roof panels with stronger curvatures can be realized.

The photovoltaic layer system preferably comprises at least one photovoltaically active absorber layer between a front electrode layer and a back electrode layer. The front electrode layer is arranged on the side of the absorber layer facing the outer panel. The back electrode layer is arranged on the side of the absorber layer facing the substrate.

The photovoltaically active absorber layer preferably comprises at least one p-type semiconductor layer. The p-type semiconductor layer can contain, for example, amorphous, micromorphous, or polycrystalline silicon, cadmium telluride (CdTe), cadmium selenide (CdSe), gallium arsenide (GaAs), or semiconducting organic polymers or oligomers.

The p-type semiconductor layer contains, in a particularly preferred embodiment of the invention, a chalcopyrite semiconductor such as a compound of the group copper-indium-sulfur/selenium (CIS), for example, copper-indium-diselenide (CuInSe$_2$), or a compound of the group copper-indium-gallium-sulfur/selenium (CIGS), for example, Cu(InGa)(SSe)$_2$. CI(G)S-based semiconductor layers are distinguished by a particularly high absorption coefficient due to a band gap adapted to the spectrum of sunlight. This is particularly advantageous with regard to the power of the photovoltaic layer system. Moreover, a homogeneous, dark appearance of the roof panel without color casts is achieved by a CI(G)S-based absorber layer. The absorber layer can be doped with metals, preferably sodium. The photovoltaically active absorber layer preferably has a layer thickness from 500 nm to 5 µm, particularly preferably from 1 µm to 3 µm.

In an alternative particularly preferred embodiment of the invention, the absorber layer contains semiconducting organic polymers or oligomers. In the case of such layer systems, the transparency is advantageously adjustable, in particular through the selection of the layer thickness and the material of the active absorber layer as well as the material of the back electrode. Thus, an advantageously dark appearance can be realized by such layer systems.

The back electrode layer can contain, for example, at least one metal, preferably molybdenum, titanium, tungsten, nickel, titanium, chromium, and/or tantalum. The back electrode layer preferably has a layer thickness from 300 nm to 600 nm.

The front electrode layer is transparent in the spectral range in which the absorber layer is sensitive. The front electrode layer can contain, for example, an n-type semiconductor, preferably aluminum-doped zinc oxide or indium tin oxide. The front electrode layer preferably has a layer thickness from 500 nm to 2 µm.

The electrode layers can also contain silver, gold, copper, nickel, chromium, tungsten, tin oxide, silicon dioxide, silicon nitride, and/or combinations as well as mixtures thereof.

The electrode layers can also include a layer stack of different individual layers. Such a layer stack can contain, for example, a diffusion barrier layer made, for example, of silicon nitride, to prevent diffusion of ions into the photovoltaically active absorber layer.

The photovoltaic layer system can, of course, include other individual layers known to the person skilled in the art, for example, a buffer layer to adjust the electronic properties between the absorber layer and an electrode layer.

The photovoltaic layer system can be divided, in an advantageous embodiment of the invention, by suitable patterning and connection known per se of the back electrode layer, the absorber layer, and the front electrode layer, into individual photovoltaically active regions, so-called solar cells. Such divided photovoltaic layer systems are known, for example, from EP 2200097 A1. The division is done by incisions using a suitable patterning technology such as laser writing and machining, for example, by drossing or scratching. The individual solar cells are connected to each other in series in an integrated form via a region of the back electrode.

The thermoplastic layer preferably contains collecting conductors known per se, so-called "busbars", for the electrical contacting of the photovoltaic layer system. The busbars are electrically conductively connected to the front and/or back electrode layer. The busbar is advantageously implemented as a band or strip. The busbar preferably contains at least one metal or one metal alloy or is made of one metal or a metal alloy. In principle, any electrically conductive material that can be processed into films can be used for the busbar. Particularly suitable materials for the busbar are, for example, aluminum, copper, tinned copper, gold, silver, or tin and alloys thereof. The busbar has, for example, a thickness from 0.03 mm to 0.3 mm and a width from 2 mm to 16 mm. the busbars can be placed between the first and the second thermoplastic film, before these are bonded to form the thermoplastic layer. The busbars are held in the intended position by gluing of the films. Alternatively, the electrically conductive connection between the busbars and the respective electrode layer can be made, for example, by welding, bonding, soldering, clamping, or gluing by means of an electrically conductive adhesive.

The busbars can extend beyond the side edges of the thermoplastic layer and be electrically contacted outside the thermoplastic layer by suitable cables. Alternatively, the electrical contacting of the busbars can be done inside the thermoplastic layer by means of suitable cables, preferably flat conductors such as foil conductors. For this, the cables are connected to the busbars before the bonding of the first and the second thermoplastic film such that the cables extend from the busbars in the interior of the thermoplastic layer beyond its side edges.

The photovoltaic layer system can be divided into subsections physically separated from each other. This includes subsections that are connected to each other directly by none of the individual layers of the photovoltaic layer system, i.e., without the use of additional connecting elements. Such a subsection preferably has length and a width from 100 mm to 2000 mm, particularly preferably from 500 mm to 1000 mm. The distance between two adjacent subsections is preferably from 1 mm to 100 mm, particularly preferably from 10 mm to 50 mm. The subsections can have, for example, a rectangular surface and be arranged in the form of rows parallel to each other. The individual subsections are preferably connected to each other in parallel and/or in series by means of electrically conductive connecting elements depending on the intended use. The electrically conductive connecting elements are, for example, implemented as bands or strips contain at least one metal or one metal alloy. The electrically conductive connecting elements preferably contain at least aluminum, copper, tinned copper, gold, silver, or tin and alloys thereof. The electrically conductive connecting elements preferably have a thickness from 0.03 mm to 0.3 mm. The subsections of the photovoltaic layer system can also be divided into groups wherein the subsections of one group are in each case connected in series to each other and wherein the groups are connected to each other in parallel, for example, by connection to common busbars.

The area of the photovoltaic layer system is preferably from 50% to 100% of the area of the roof panel according to the invention, for example, from 50% to 90%. This is particularly advantageous with regard to the power of the integrated photovoltaic module as well as uniform appearance of the roof panel. The area of the photovoltaic layer system can be, for example, from 0.1 m$^2$ to 5 m$^2$, preferably 0.5 m$^2$ to 2 m$^2$.

The integrated photovoltaic module has, in a preferred embodiment, a specific maximum achievable power $P_{MPP}$ from 10 W/m$^2$ to 300 W/m$^2$, particularly preferably from 50 W/m$^2$ to 150 W/m$^2$. The power is measured under the usual standard test conditions for photovoltaic modules (irradiance of 1000 W/m$^2$, temperature 25° C., radiation spectrum AM 1.5 global).

The object of the invention is further accomplished by a method for producing a roof panel having an integrated photovoltaic module, wherein at least (a) a photovoltaic layer system is introduced into a thermoplastic layer, (b) the thermoplastic layer is laminarily arranged between a substrate, which contains at least one polymer, and an outer panel, and (c) the substrate is bonded to the outer panel via the thermoplastic layer under the action of heat, vacuum, and/or pressure.

The thermoplastic layer is preferably formed from at least one first and one second thermoplastic film, with the photovoltaic system laminarily introduced between the first and the second thermoplastic film.

The photovoltaic layer system can be deposited directly onto a surface of the first or the second thermoplastic film. The photovoltaic layer system can, alternatively, for example, be deposited onto a carrier film that is subsequently placed between the first and the second thermoplastic film. Other layers, for example, adhesion-promoting layers or other carrier films can be arranged between the first and the second thermoplastic film.

The deposition of the thermoplastic layer system on a surface, for example, of the first or second thermoplastic film or a carrier film is preferably done by cathode sputtering, vapor deposition, or chemical vapor deposition (CVD).

In one embodiment of the method according to the invention, the substrate or the outer panel is prepared first. At least the first thermoplastic film is arranged on one surface of the substrate or the outer panel. When the photovoltaic layer system is provided on a carrier film, this carrier film is laminarily arranged on the first thermoplastic film. Then, at least the second thermoplastic film is laminarily arranged on the first thermoplastic film or the carrier film. In this embodiment, in process step (b), the outer panel or the substrate is laminarily arranged on the second thermoplastic film by which means the thermoplastic layer with the photovoltaic system is arranged between the substrate and the outer panel.

In an alternative embodiment, the photovoltaic layer system is arranged between at least the first and the second thermoplastic film, even before one of the thermoplastic films is arranged on the substrate or the cover panel. The first and the second thermoplastic film are extensively bonded via the photovoltaic layer system to form a pre-laminated thermoplastic layer. The bonding is preferably done under the action of heat, pressure, and/or vacuum. In process step (b), the prefabricated pre-laminate with the embedded photovoltaic layer system is arranged between the substrate and the cover panel.

The advantage of such a pre-laminate resides in simple and economical production of the roof panel according to the invention. The pre-laminate can be prepared before the bonding of the substrate to the outer panel. Then, the conventional methods for producing a roof panel can be used, wherein the thermoplastic intermediate layer via which the substrate is conventionally glued to the outer panel is replaced by the pre-laminate. In addition, the photovoltaic system in the interior of the pre-laminate is advantageously protected from damage, in particular corrosion. Consequently, the pre-laminate can clearly be prepared, even in large quantities, before the actual production of the roof panel, which can be desirable for economic reasons. The pre-laminate can be bonded to the substrate and the outer panel directly or via other thermoplastic film.

Preferably, the back and/or the front electrode layer for making electrical contact are electrically conductively connected to, for example, busbars and/or foil conductors after the application of the photovoltaic layer system and before the bonding of the first and second thermoplastic layer.

When the substrate is implemented as a rigid panel, the bonding of the substrate to the outer panel is done via the thermoplastic layer by methods known per se for producing composite panels. For example, so-called "autoclave methods" can be performed at an elevated pressure of roughly 10 bar to 15 bar and temperatures of 130° C. to 145° C. for roughly 2 hours. Vacuum bag or vacuum ring methods known per se operate, for example, at roughly 200 mbar and 130° C. to 145° C.

The outer panel, the thermoplastic layer, and the substrate can also be pressed in a calender between at least one pair of rollers to form a roof panel according to the invention. Systems of this type are known for producing laminated glazings and normally have at least one heating tunnel upstream from a pressing unit. The temperature during the pressing procedure is, for example, from 40° C. to 150° C. Combinations of calendering and autoclaving methods have proved particularly valuable in practice.

Alternatively, vacuum laminators can be used. These consist of one or a plurality of heatable and evacuable chambers in which the outer panel and substrate can be laminated within, for example, roughly 60 minutes at reduced pressures of 0.01 mbar to 800 mbar and temperatures of 80° C. to 170° C.

If the substrate is configured as a flexible film, the bonding of the substrate to the outer panel is done via the thermoplastic layer in a particularly advantageous embodiment in the manner described in the following. Before, after, or at the same time as process step (b) and before process step (c), a separating film is arranged on the surface of the substrate facing away from the outer panel and a support panel is arranged on the surface of the separating film facing away from the substrate. The support panel is preferably a rigid panel and preferably contains glass, particularly preferably flat glass, float glass, quartz glass, borosilicate glass, or soda lime glass or plastics, preferably polyethylene, polypropylene, polycarbonate, polymethyl methacrylate, polystyrene, polyamide, polyester, polyvinyl chloride, and/or mixtures thereof. The thickness of the support panel is preferably from 1.0 mm to 25 mm, particularly preferably from 1.4 mm to 5 mm. The surface of the support panel facing the substrate should have the same curvature as the surface of the outer panel facing the substrate. The support panel is thus selected in terms of size and shape such that it would, in principle, be suitable to be bonded to the outer panel to form a composite panel. The separating film is produced from a material that is suitable for preventing durable adhesion between the support panel and the substrate. The separating film preferably contains at least one polytetrahalogen ethylene, particularly preferably at least polytetrafluoroethylene and/or polychlorotrifluoroethylene. This is particularly advantageous with regard to the adhesion-impeding properties of the separating film. The separating film preferably has a thickness from 0.01 mm to 10 mm, particularly preferably from 0.1 mm to 2.5 mm, for example, from 0.1 mm to 1 mm.

The stack made up of the outer panel, thermoplastic layer, substrate, separating film, and support panel can be subjected in a simple manner to methods known per se for producing a composite panel, for example, those described above. Thus, a durably stable bond between the outer panel and substrate is provided via the thermoplastic layer. Due to the adhesion-impeding action of the separating film, the support panel can subsequently be removed in a simple manner.

Another aspect of the invention comprises the use of a roof panel according to the invention in vehicles for travel on land, in the air, or on water, preferably in trains, streetcars, ships, and motor vehicles such as buses, trucks, and, in particular, passenger cars. By means of the electrical energy obtained using the integrated photovoltaic module, the battery of an electric vehicle can, for example, be cooled, the passenger compartment can be cooled while the vehicle is parked, a secondary battery of the vehicle can be charged, or a heatable window can be operated while the vehicle is parked.

Figure 2:
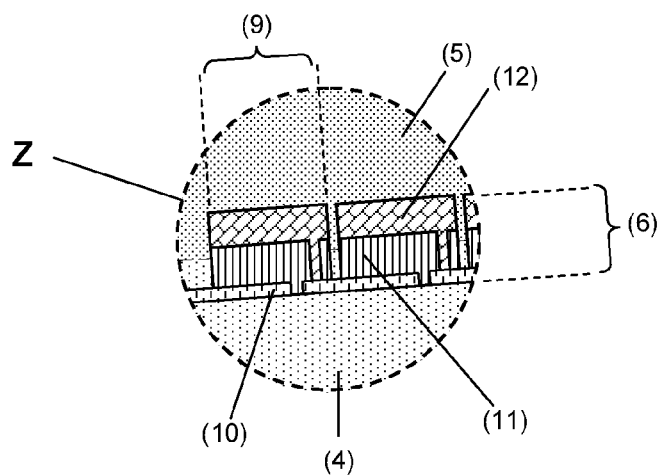
Figure 3:
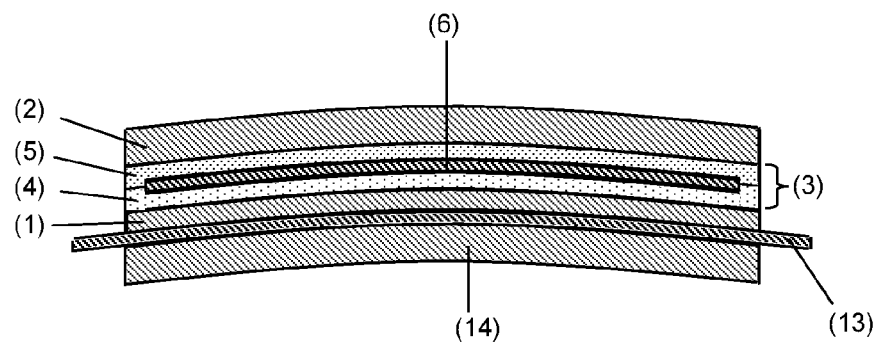
Figure 4:
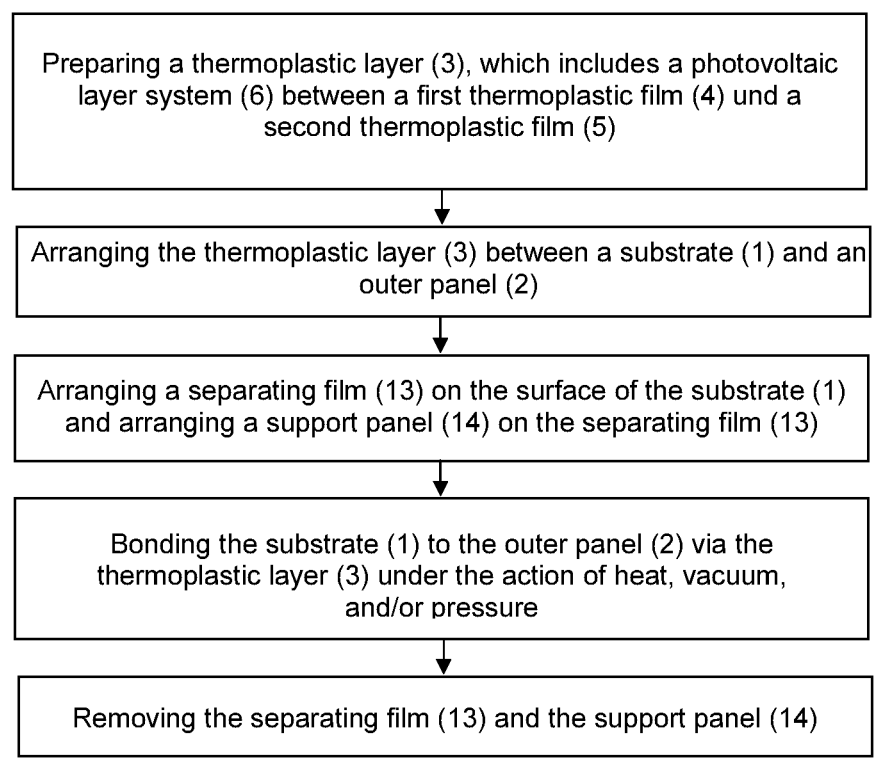

The invention is explained in detail with reference to drawings and exemplary embodiments. The drawings are schematic representations and not true to scale. The drawings in no way restrict the invention. They depict:

FIG. 1 a cross-section through one embodiment of the roof panel according to the invention having an integrated photovoltaic module, FIG. 2 an enlarged view of the section Z of FIG. 1, FIG. 3 a cross-section through the substrate, the thermoplastic layer, the outer panel, the separating film, and the support panel before the production of the roof panel according to the invention, and FIG. 4 an exemplary embodiment of the method according to the invention using a flowchart.

FIG. 1 and FIG. 2 each depict a detail of a roof panel according to the invention having an integrated photovoltaic module. The roof panel comprises a substrate 1 and an outer panel 2 that are bonded to each other by means of a thermoplastic layer 3. The roof panel is the roof panel of a motor vehicle. The outer panel 2 is made of thermally prestressed soda lime glass and has a thickness of 3 mm. The substrate 1 is made of polyvinyl fluoride (DuPont Tedlar©) and has a thickness of 0.8 mm. The surfaces of the outer panel 2 and the substrate 1 facing away from each other represent the outer surfaces of the roof panel. In the installed position, the surface of the outer panel 2 facing away from the substrate 1 faces the external surroundings and the surface of the substrate 1 facing away from the outer panel 2 faces the vehicle interior. The roof panel is formed with a curve, as is usual for motor vehicle roof panels. The roof panel has a width of 110 cm and a length of 130 cm The thermoplastic layer 3 formed from one first thermoplastic film 4 and one second thermoplastic film 5. The first and the second thermoplastic film 4, 5 are made of ethylene vinyl acetate (EVA) and have in each case a thickness of roughly 0.7 mm. The thermoplastic films 4, 5 are schematically depicted for clarity. After the lamination of the roof panel, the transition between the thermoplastic films 4, 5 need not be discernible as a clear boundary, in particular when the thermoplastic films 4, 5 are made from the same material. A photovoltaic layer system 6 is arranged between the first thermoplastic film 4 and the second thermoplastic film 5. The photovoltaic layer system 6 does not extend all the way to the side edges of the thermoplastic layer 3. A peripheral edge region of the thermoplastic layer 3 with a width of roughly 50 mm is not provided with the photovoltaic layer system 6. In this edge region, the first and the second thermoplastic film 4, 5 are bonded directly to each other. The photovoltaic layer system 6 is thus advantageously protected in the interior of the thermoplastic layer 3 against environmental influences, in particular corrosion. The photovoltaic layer system 6 as a whole has an area of roughly 1.2 m². The area of the photovoltaic layer system 6 is thus roughly 84% of the area of the roof panel.

The photovoltaic layer system 6 comprises a back electrode layer 10 that contains molybdenum and has a layer thickness of roughly 300 nm. The photovoltaic layer system 6 further contains a photovoltaically active absorber layer 11 that contains sodium-doped Cu(InGa)(SSe)$_2$ and has a layer thickness of roughly 2 µm. The photovoltaic layer system 6 further contains a front electrode layer 12 that contains aluminum-doped zinc oxide (AZO) and has a layer thickness of roughly 1 µm. A buffer layer (not shown) that contains a single layer of cadmium sulfide (CdS) and a single layer of intrinsic zinc oxide (i-ZnO) is arranged between the front electrode layer 12 and the absorber layer 11. The buffer layer effects an electronic adjustment between the absorber layer 11 and the front electrode layer 12.

The photovoltaic layer system 6 is divided into subsections 7. The subsections 7 are physically separated from each other, are, in other words, not directly connected to each other via any of the individual layers of the photovoltaic layer system 6. The photovoltaic layer system 6 has total of nine of these subsections 7 that are arranged in three rows parallel to each other with, in each case, three subsections 7. FIG. 1 depicts the cross-section through one of these rows. The subsections 7 of each of these rows are connected to each other in series. The connecting is done by a suitable electrical connection between the electrode layers 10, 12 of respective adjacent subsections 7 via electrically conductive connecting elements 8. The electrically conductive connecting elements 8 are configured as strips made of aluminum with a thickness of 0.2 mm. The distance between adjacent subsections 7 is roughly 5 mm. The two outer subsections 7 of the depicted row of subsections 7 connected in series are connected in each case to a busbar (not shown). In each case, a foil conductor (also not shown) that extends beyond the side edge of the thermoplastic layer 3 and serves for the external electrical connection is connected to the busbar. Each of the three rows of these subsections 7 connected to each other in series is connected to the same busbars, in other words, the rows are connected in parallel.

Each of the subsections 7 of the photovoltaic layer system 6 is divided, by methods known per se for producing a thin-film photovoltaic module, into individual photovoltaically active regions, so-called "solar cells" 9. The solar cells 9 of one subsection 7 are in each case connected to each other in series in a monolithically integrated form via a region of the back electrode layer 10 and a region of the front electrode layer 12, which is guided to the back electrode layer 10.

FIG. 3 depicts a cross-section through the components of a roof panel according to the invention before bonding to form the roof panel in a preferred embodiment of the method according to the invention. The substrate 1, the thermoplastic layer 3 with the first thermoplastic film 4, with the photovoltaic layer system 6, and with the second thermoplastic film 5 and the outer panel 2 are laminarily arranged one over another. Optionally, the thermoplastic films 4, 5 and the photovoltaic layer system 6 can already be present as a pre-laminated thermoplastic layer 3. The substrate 1, the thermoplastic layer 3, the photovoltaic layer system 6, and the outer panel 2 are configured as with the roof panel of FIG. 1. A support panel 14 is arranged on the surface of the substrate 1 facing away from the outer panel 2. The support panel 14 is made of soda lime glass and implemented the same as the outer panel 2 in terms of size and shape. A separating film 13 is arranged between the support panel 14 and the substrate 1. The separating film 13 is made of polytetrafluoroethylene and has a thickness of 1 mm. The separating film 13 covers the entire surface of the substrate 1. The area of the separating film 13 is thus at least as large as the surface of the substrate 1, but can also be larger, as in the example depicted, and can protrude beyond the side edges of the substrate 1.

Because of the support panel 14, the roof panel according to the invention can be produced in a simple manner although the substrate 1 is implemented as a flexible film. For the bonding of substrate 1 and roof panel 2 via the thermoplastic layer 3, the stack composed of support panel 14, separating film 13, substrate 1, thermoplastic layer 3, and outer panel 2 can be subjected in a simple manner to methods known per se for producing a composite glazing. Thus, a durably stable bond between the outer panel 2 and the substrate 1 is achieved via the thermoplastic layer 3. The separating film 13 impedes adhesion between the support panel 14 and the substrate 1. After the production of the roof panel, the support panel 14 and the separating film 13 can be removed in a simple manner.

FIG. 4 depicts, by way of example, an embodiment of the method according to the invention for producing a roof panel with an integrated photovoltaic module.

It has been demonstrated that, with the polymer substrate 1 according to the invention, roof panels can be realized that have, in contrast to conventional roof panels with an integrated photovoltaic module, significantly reduced weight, but still have sufficient stability to enable use as roof panels, for example, in motor vehicles. Through the flexibility of the thermoplastic layer 3 with the photovoltaic layer system 6, even roof panels with large radii of curvature can be realized. Moreover, the photovoltaic layer structure 6 can be arranged extensively in the thermoplastic layer 3. These advantages of the invention were unexpected and surprising for the person skilled in the art.

LIST OF REFERENCE CHARACTERS (1) substrate
(2) outer panel
(3) thermoplastic layer
(4) first thermoplastic film
(5) second thermoplastic film
(6) photovoltaic layer system
(7) subsection of the photovoltaic layer system 6
(8) electrically conductive connecting element
(9) solar cell
(10) back electrode layer
(11) absorber layer
(12) front electrode layer
(13) separating film
(14) support panel
Z section of the roof panel

The invention claimed is:

1. A method for producing a roof panel having an integrated photovoltaic module, comprising:
   (a) arranging a photovoltaic layer system between a first thermoplastic film and a second thermoplastic film, thereby obtaining a composite layer;
   (b) arranging the composite layer laminarily between a substrate, which contains at least one polymer and is implemented as a flexible film, and an outer panel containing glass;
   (c) bonding the substrate to the outer panel via the composite layer under the action of heat, vacuum, and/or pressure between at least one pair of rollers, wherein a support panel is arranged via a separating film on a surface of the substrate facing away from the outer panel, wherein the separating film contains at least one polytetrahalogen ethylene; and
   (d) after bonding the substrate to the outer panel, removing the separating film and support panel.

2. The method according to claim 1, further comprising: after process step (a) and before process step (b), bonding the photovoltaic layer system to the first thermoplastic film and to the second thermoplastic film under the action of heat, vacuum, and/or pressure.

3. The method according to claim 1, wherein the separating film has a thickness from 0.01 mm to 10 mm.

4. The method according to claim 1, wherein the substrate has a thickness from 0.02 mm to 2 mm.

5. The method according to claim 1, wherein the substrate has a thickness from 0.1 mm to 1.5 mm.

6. The method according to claim 1, wherein the substrate has a thickness from 0.15 mm to 0.8 mm.

7. The method according to claim 1, wherein the at least one polymer in the substrate is selected from the group consisting of: polyvinyl fluoride, polyvinylidene fluoride, ethylene tetrafluoroethylene, and polytetrafluoroethylene.

8. The method according to claim 1, wherein the photovoltaic layer system has a photovoltaically active absorber layer between a front electrode layer and a back electrode layer and wherein the photovoltaically active absorber layer material is selected from the group consisting of: amorphous, micromorphous, or polycrystalline silicon, cadmium telluride (CdTe), cadmium selenide (CdSe), gallium arsenide (GaAs), semiconducting organic polymers or oligomers or copper indium (gallium) sulfur/selenium (CI(G)S).

9. The method according to claim 1, wherein the outer panel contains flat glass, float glass, quartz glass, borosilicate glass, or soda lime glass, and has a thickness from 2.8 mm to 5 mm.

10. The method according to claim 1, wherein the photovoltaic layer system is divided into subsections that are connected to each other in series and/or in parallel via electrically conductive connecting elements and/or busbars.

11. The method according to claim 1, wherein an area of the photovoltaic layer system is from 50% to 100% of an area of the roof panel.

12. The method according to claim 1, wherein the composite layer contains at least ethylene vinyl acetate (EVA), polyvinyl butyral (PVB), polyurethane (PU), polyethylene (PE), and/or polyethylene terephthalate (PET) and has a thickness from 0.5 mm to 5 mm.

13. The method according to claim 12, wherein the composite layer has a thickness from 1 mm to 3 mm.

14. The method according to claim 1, wherein the roof panel has, at least in one region, a radius of curvature from 600 mm to 900 mm.

15. The method according to claim 1, wherein the specific power of the integrated photovoltaic module is from 10 $W/m^2$ to 300 $W/m^2$.

16. The method according to claim 1, wherein the specific power of the integrated photovoltaic module is from 50 $W/m^2$ to 150 $W/m^2$.

* * * * *